(12) United States Patent
Asai

(10) Patent No.: US 9,553,037 B2
(45) Date of Patent: Jan. 24, 2017

(54) SEMICONDUCTOR DEVICE

(71) Applicant: TOYOTA JIDOSHA KABUSHIKI KAISHA, Toyota-shi, Aichi-ken (JP)

(72) Inventor: Rintaro Asai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/909,772

(22) PCT Filed: Aug. 21, 2014

(86) PCT No.: PCT/JP2014/071924
§ 371 (c)(1),
(2) Date: Feb. 3, 2016

(87) PCT Pub. No.: WO2015/033794
PCT Pub. Date: Mar. 12, 2015

(65) Prior Publication Data
US 2016/0190036 A1    Jun. 30, 2016

(30) Foreign Application Priority Data

Sep. 6, 2013 (JP) .................................. 2013-185152

(51) Int. Cl.
*H01L 23/34* (2006.01)
*H01L 23/40* (2006.01)
*H01L 23/433* (2006.01)
*H01L 23/051* (2006.01)
*H01L 23/00* (2006.01)
*H01L 23/28* (2006.01)
*H01L 23/31* (2006.01)

(52) U.S. Cl.
CPC ......... *H01L 23/4006* (2013.01); *H01L 23/051* (2013.01); *H01L 23/28* (2013.01); *H01L 23/40* (2013.01); *H01L 23/4334* (2013.01); *H01L 24/33* (2013.01); *H01L 23/3107* (2013.01); *H01L 2023/4056* (2013.01); *H01L 2023/4087* (2013.01); *H01L 2924/13055* (2013.01)

(58) Field of Classification Search
CPC ...... H01L 23/4006; H01L 23/28; H01L 23/40; H01L 23/051; H01L 23/4334; H01L 23/3107
See application file for complete search history.

(56) References Cited

U.S. PATENT DOCUMENTS

| 2004/0089931 A1 | 5/2004 | Nakajima et al. |
| 2007/0267739 A1 | 11/2007 | Kajiwara et al. |
| 2011/0298112 A1* | 12/2011 | Mori .................... H05K 1/0243 257/675 |

FOREIGN PATENT DOCUMENTS

| JP | 2000-174180 A | 6/2000 |
| JP | 2004-165406 A | 6/2004 |

(Continued)

*Primary Examiner* — (Vikki) Hoa B Trinh
(74) *Attorney, Agent, or Firm* — Oliff PLC

(57) ABSTRACT

A semiconductor device includes a semiconductor element having a front surface and a rear surface, a pair of heat sinks disposed facing each other so as to sandwich the semiconductor element, and attached respectively to the front surface and the rear surface, and a fastening screw fastening the pair of the heat sinks in the facing direction, the fastening screw having insulation property. Threads are arranged on at least a part of the fastening screw in an axis direction of the fastening screw between the pair of the heat sinks.

1 Claim, 4 Drawing Sheets

(56) References Cited

FOREIGN PATENT DOCUMENTS

| JP | 2004-303900 A | 10/2004 |
|----|---------------|---------|
| JP | 2007-311441 A | 11/2007 |
| JP | 2008-300476 A | 12/2008 |
| JP | 2009-027840 A | 2/2009 |
| JP | 2010-056355 A | 3/2010 |

* cited by examiner

SEMICONDUCTOR DEVICE

TECHNICAL FIELD

The present invention relates to a semiconductor device.

BACKGROUND ART

Patent Document 1 (Japanese Patent Application Publication No. 2010-056355 A) discloses a technology for transfer-molding a substrate on which electronic components have been mounted with sealing resin. A semiconductor device disclosed in Patent Document 1 includes a plurality of substrates, at least one of which has electronic components mounted on both surfaces thereof. The plurality of substrates is disposed in a stacked manner with a space therebetween. Further, this semiconductor device includes a supporting structure configured to keep the space between the substrates constant.

SUMMARY OF INVENTION

Technical Problem

In the technology disclosed in Patent Document 1 when the plurality of substrates is transfer-molded with the sealing resin, the supporting structure between the substrates is molded with the sealing resin. The sealing resin covers the substrates and the supporting structure, and makes close contact with them. However, heat sinks may be subject to pressure during resin injection, and force may thus be applied to a soldered portion to cause the solder to crack. Further, thermal contraction of the sealing resin being in close contact with the substrates and the supporting structure may cause the sealing resin to peel from the substrates and the supporting structure.

It is therefore an object of the present disclosure to provide a semiconductor device in which such solder cracking and such peeling of sealing resin can be suppressed.

Solution to Technical Problem

A semiconductor device disclosed in the present disclosure comprises a semiconductor element having a front surface and a rear surface, a pair of heat sinks disposed facing each other so as to sandwich the semiconductor element, and attached respectively to the front surface and the rear surface via solder; and a fastening screw fastening the pair of the heat sinks in the facing direction, the fastening screw having insulation property. Threads are arranged on at least a part of the fastening screw in an axis direction of the fastening screw between the pair of the heat sinks.

According to this configuration, when sealing resin with which the semiconductor element is sealed is filled between the pair of the heat sinks, the sealing resin makes close contact with the threads of the fastening screw. For this reason, even in an event of thermal contraction of the sealing resin, the sealing resin will not peel from the fastening screw, so that peeling of the sealing resin can be suppressed. Further, pressure applied on the heat sinks can be received by a screw portion. This makes it possible to lower stress on the solder and thus prevent the solder from cracking.

In the above semiconductor device, sealing resin may be filled between the pair of the heat sinks, the sealing resin being in close contact with the threads of the fastening screw.

DESCRIPTION OF EMBODIMENTS

Figure 1:
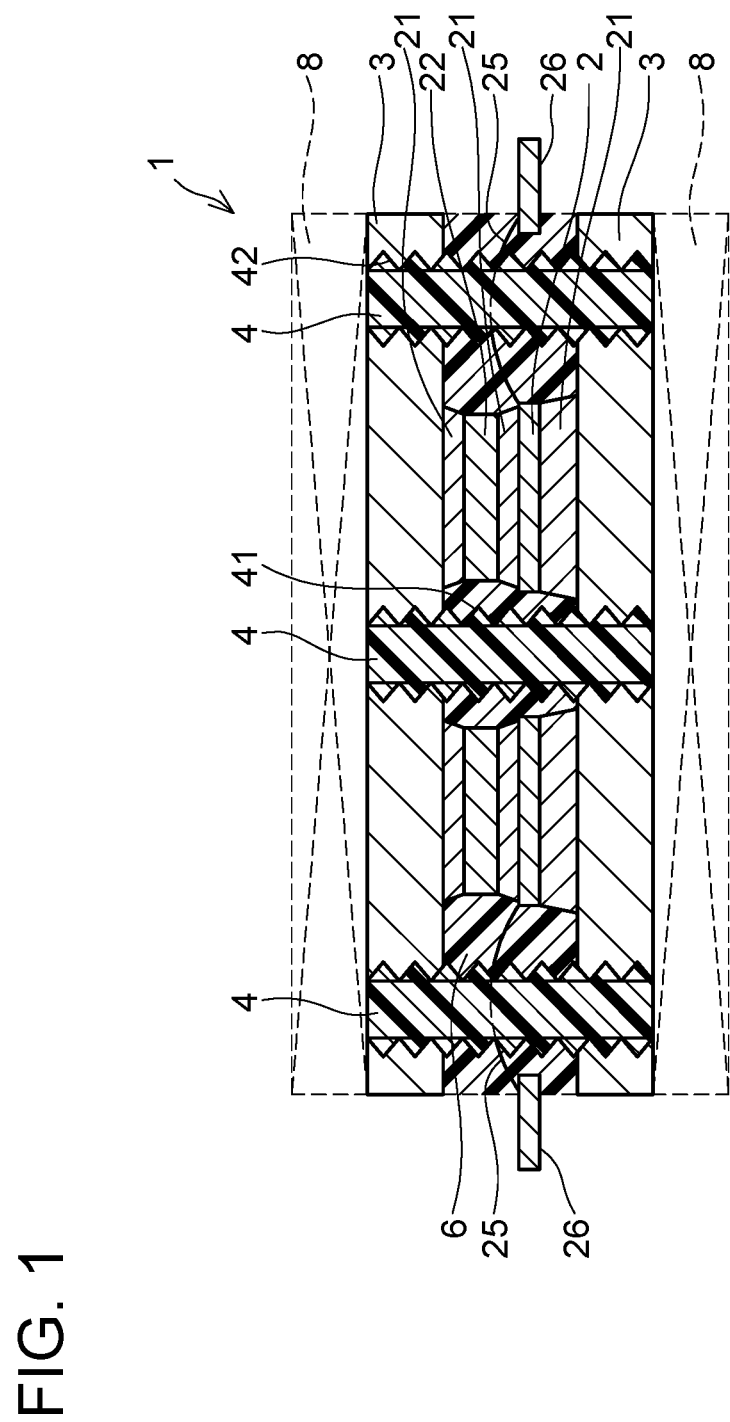
FIG. 1 is a longitudinal section view of a semiconductor device according to the present embodiment.

An embodiment is described below with reference to the accompanying drawings. As shown in FIG. 1, a semiconductor device 1 comprises: semiconductor elements 2 each having a front surface and a rear surface; a pair of heat sinks 3 disposed facing each other so as to sandwich the respective semiconductor elements 2; and fastening screws 4 fastening the pair of the heat sinks 3 in the facing direction (i.e., the direction in which the pair of the heat sinks 3 move closer to each other), the fastening screws 4 having insulation property.

Each semiconductor element 2 is a vertical semiconductor element (e.g., a power semiconductor element), and has a front surface electrode provided on its front surface and a rear surface electrode provided on its rear surface. Usable examples of the semiconductor element 2 include an IGBT, an FWD, and the like. The semiconductor element 2 is disposed between the pair of the heat sinks 3. The semiconductor element 2 is electrically connected to a signaling lead 26 via a bonding wire 25.

The pair of upper and lower heat sinks 3 (which function also as lead frames in the present embodiment) are disposed parallel to each other. The heat sinks 3 are disposed respectively on a front surface side and a rear surface side of the semiconductor elements 2. One surface of each of the heat sinks 3 faces the semiconductor elements 2, and the other surface of each of the heat sinks 3 is exposed facing outward. A cooler 8 can be attached to the other surface of each of the heat sinks 3 that faces outward. The coolers 8 are used to cool the semiconductor elements 2 via the heat sinks 3. The semiconductor elements 2 are cooled from its front surface side and its rear surface side. The coolers 8 may have a publicly-known construction of a water-cooled or air-cooled type. Each of the heat sinks 3 is made of metal such as copper or aluminum, and has a thickness of about several millimeters, for example. The pair of the heat sinks 3 is attached respectively to the front and rear surfaces of the semiconductor elements 2 with solders 21. Sealing resin 6 is filled between the upper and lower heat sinks 3. Arranged in each of the heat sinks 3 are screw grooves 42 to which threads 41 of the fastening screws 4 are screwed.

Spacers 22 are disposed between the respective semiconductor elements 2 and the heat sink 3 that is on a front surface (upper) side. Each spacer 22 is made of metal such as copper, and has electrical conductivity.

The solders 21 are filled between the heatsink 3 that is on a rear surface (lower) side and the respective semiconductor elements 2, between the respective semiconductor elements 2 and the respective spacers 22, and between the respective spacers 22 and the front surface side (upper side) heat sink 3. This causes the pair of the heat sinks 3, the semiconductor elements 2, and the spacers 22 to be fixed by the solders 21.

The threads 41 are arranged on each fastening screw 4 entirely along an axis direction of the fastening screw 4. The threads 41 are also arranged on a part of the fastening screw 4 that is located between the pair of the heat sinks 3. The threads 41 are helically arranged on an outer circumferential surface of the fastening screw 4. Each fastening screw 4 extends in a direction in which the pair of the heat sinks 3 face each other (i.e., direction in which the pair of the heat sinks 3 move closer to or away from each other), and is screwed to the upper and lower heat sinks 3. In this way, the fastening screws 4 fasten the pair of the heat sinks 3 in the facing direction (which is a vertical direction in FIG. 1). In the present embodiment, the pair of the heat sinks 3 is fastened by three fastening screws 4. Ends of each fastening screw 4 are screwed to the heat sinks 3, respectively, and a central part thereof is covered with the sealing resin 6. Parts of the threads 41 which are located on the central parts of the respective fastening screws 4 are in close contact with the sealing resin 6. The fastening screws 4 are made of an insulating material. For example, the fastening screws 4 are made of thermoplastic resin such as PPS (polyphenylene sulfide) or PEEK (polyether ether ketone). This keeps the pair of the heat sinks 3 insulated even when they are fastened by the fastening screws 4.

Figure 2:
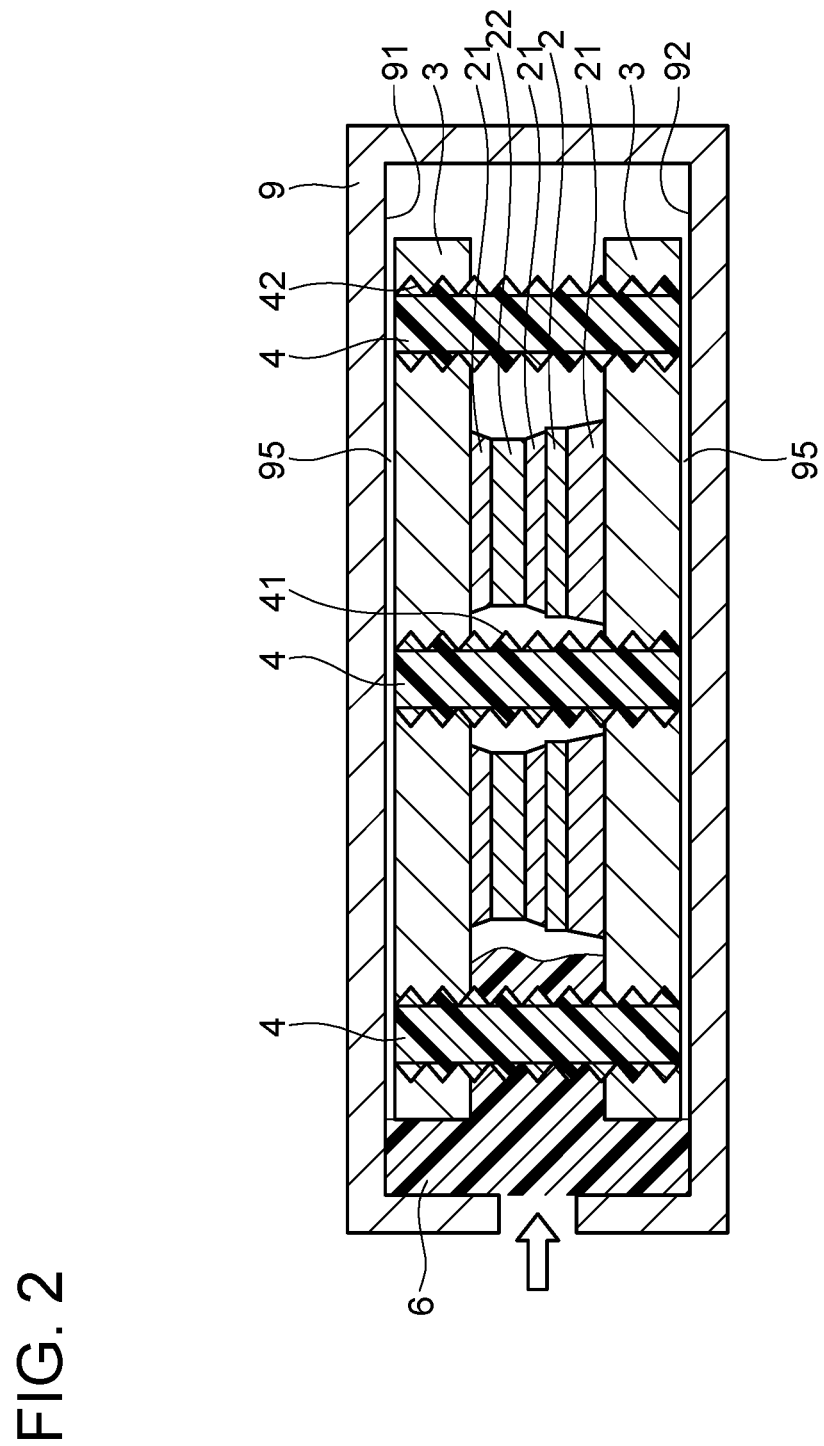
FIG. 2 is a diagram for explaining a method for filling sealing resin.

The semiconductor elements 2 are sealed with the sealing resin 6. Further, the sealing resin 6 is in close contact with the fastening screws 4. A usable example of the sealing resin 6 is publicly-known sealing resin such as epoxy resin. As shown in FIG. 2, filling of the sealing resin 6 is carried out by injecting the sealing resin 6 into a mold 9 as indicated by an arrow, with the semiconductor device 1 placed in the mold 9 (FIG. 2 omits to show the bonding wires 25 and the signaling leads 26). The sealing resin 6 injected into the mold 9 flows into a space between the pair of the heat sinks 3, and the semiconductor elements 2 are sealed with the sealing resin 6. At this occasion, the pair of the heat sinks 3 are not pulled apart by pressing force of the sealing resin 6 because the pair of the heat sinks 3 has been fastened by the fastening screws 4. Further, the sealing resin 6 makes close contact with the threads 41 of each fastening screw 4. That is, the sealing resin 6 is also filled between the threads 41.

The mold 9 has an upper surface 91 and a lower surface 92. The upper surface 91 and the lower surface 92 face the semiconductor device 1 placed inside the mold 9. It is preferable that space 95 between one of the heat sinks 3 and the upper surface 91 of the mold 9 and between the other of the heat sink 3 and the lower surface 92 of the mold 9, respectively, has a size such that the sealing resin 6 does not flow into the space 95. This prevents filling of the sealing resin 6 on the other surface side of each heat sink 3 (i.e., the upper surface side of the upper heat sink 3 and the lower surface side of the lower heat sink 3), and thus causes the other surface side of each heat sink 3 to be exposed outside when the semiconductor device 1 is taken out of the mold 9. The cooler 8 can be disposed on the other surface side of each heat sink 3 thus exposed. It should be noted that the size of the space 95 between one of the heat sinks 3 and the upper surface 91 of the mold 9 and between the other of the heat sink 3 and the lower surface 92 of the mold 9 is not limited to any particular size. When the space 95 is so large that the sealing resin 6 flows onto the other surface side of each heat sink 3, the sealing resin 6 is removed by grinding after the sealing resin 6 has cured.

As is evident from the above descriptions, in the semiconductor device 1 according to the present embodiment, the pair of the heat sinks 3 can be clamped in the facing direction because the pair of the heat sinks 3 is fastened by the fastening screws 4. This clamping force allows for resistance to the pressing force of the sealing resin 6 when the sealing resin 6 is filled between the pair of the heat sinks 3. Therefore, when the sealing resin 6 is filled, the pair of the heat sinks 3 is not pulled apart by the pressing force of the sealing resin 6, nor do the heat sinks 3 peel off and fall from the semiconductor element 2. Further, since the threads 41 are provided on the fastening screws 4 between the pair of the heat sinks 3, the sealing resin 6 makes close contact with the fastening screws 4 via the threads 41. This makes it possible to suppress the peeling of the sealing resin 6 from the fastening screws 4 even in the event of thermal contraction of the sealing resin 6, as the sealing resin 6 is in close contact with the fastening screws 4. That is, in the technology disclosed in Patent Document 1, the sealing resin may peel from the supporting structure in the event of thermal contraction of the sealing resin as there are no threads that make close contact with the sealing resin between the pair of the heat sinks. In the present embodiment, the fastening screws 4 and the sealing resin 6 are bound to each other with higher binding force to suppress the peeling of the sealing resin 6 because the threads 41 of the fastening screws 4 are also arranged between the pair of the heat sinks 3.

Although an embodiment has been described above, a specific aspect is not limited to the embodiment described above. For example, although in the embodiment described above the threads 41 are provided on each fastening screw 4 entirely along the axis direction of the fastening screw 4 in a position between the pair of the heat sinks 3, this configuration does not imply any limitation. The threads 41 may only be provided on a part of each fastening screw 4 in the axis direction of the fastening screw 4. This configuration, too, brings the sealing resin 6 into close contact with the threads 41 to suppress the peeling of the sealing resin 6.

Further, although in the embodiment described above an entirety of each fastening screw 4 is made of thermoplastic resin, the entirety of the fastening screw 4 does not necessarily need to be made of thermoplastic resin, provided that the pair of the heat sinks 3 fastened by the fastening screws 4 are insulated. For example, threads 41 made of insulating thermoplastic resin may be provided on an outer circumferential surface of a metal core. Further, a number of the fastening screws 4 is not limited to any particular number.

Figure 3:
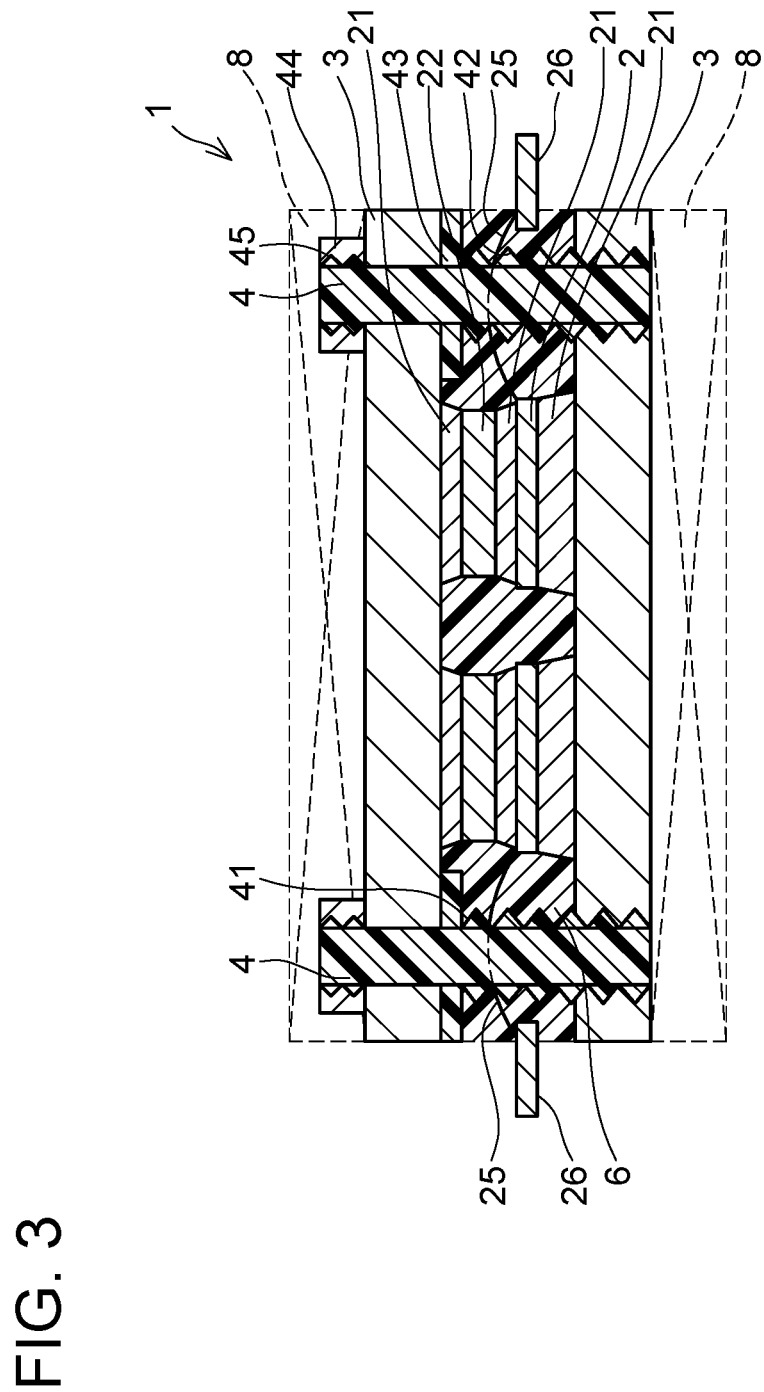
FIG. 3 is a longitudinal sectional view of a semiconductor device according to another embodiment.

Further, as shown in FIG. 3, each fastening screw 4 may include a stopper 43 configured to support the front surface side (upper side) heat sink 3. The stopper 43 extends along a direction orthogonal to the axis direction of the fastening screw 4. A height position of the stopper 43 is substantially the same as a height position of the solder 21 located on the front surface side (upper side) of the semiconductor element 2. This allows the front surface side (upper side) heat sink 3 to be supported by the stoppers 43 and soldered with the solders 21. Threads 45 to which a nut 44 is screwed are arranged on an upper end of each fastening screw 4. The heat sink 3 is sandwiched between the stoppers 43 and the nuts 44 and fixed by the nuts 44 being screwed to the threads 45. This configuration allows the front surface side heat sink 3 to be fixed at a height position by the stoppers 43. This therefore makes it possible to surely position the heat sink 3.

Figure 4:
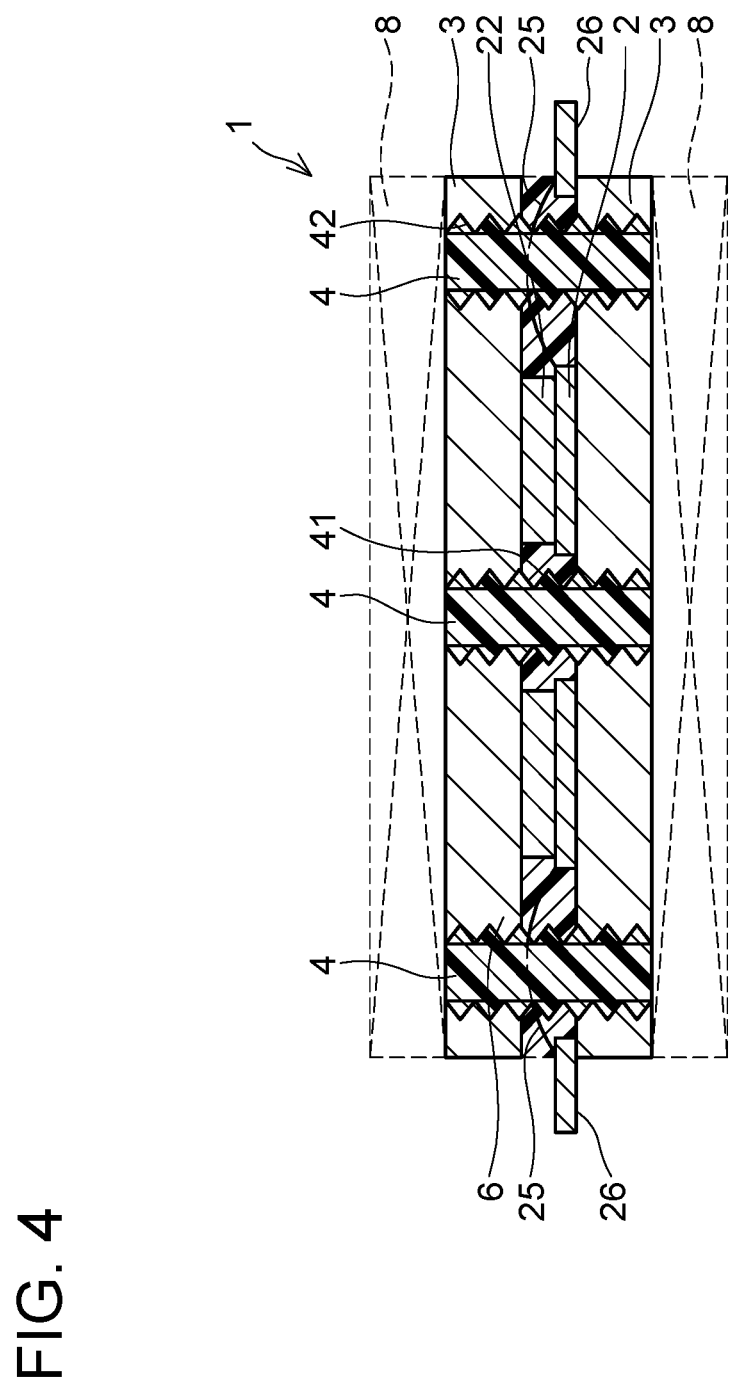
FIG. 4 is a longitudinal sectional view of a semiconductor device according to another embodiment.

Further, although in the embodiment described above the semiconductor elements 2, the spacers 22, and the pair of the heat sinks 3 are fixed with the solders 21, this configuration does not imply any limitation. In another embodiment, as shown in FIG. 4, semiconductor elements 2, spacers 22, and a pair of heat sinks 3 may be fixed without a solder 21. Each semiconductor element 2 is in contact with the corresponding spacer 22 and a rear surface side (lower side) heat sink 3. Each spacer 22 is in contact with the corresponding semiconductor element 2 and a front surface side (upper side) heat sink 3. The semiconductor elements 2 and the spacers 22 are sandwiched between the pair of the upper and lower heat sinks 3. The semiconductor elements 2, the spacers 22, and the pair of the heat sinks 3 are fixedly clamped and pressure-bonded by fastening screws 4 in a direction in which the pair of the heat sinks 3 face each other. The semiconductor elements 2 and the spacers 22 are held between the pair of the heat sinks 3 by being clamped from top and bottom by the fastening screws 4. This provision of the fastening screws 4, the semiconductor elements 2 and the spacers 22 can be fixed between the pair of the heat sinks 3 even without the use of solder.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

- 1: semiconductor device
- 2: semiconductor element
- 3: heat sink
- 4: fastening screw
- 6: sealing resin
- 8: cooler
- 9: mold
- 21: solder
- 22: spacer
- 41: threads
- 42: screw groove
- 43: stopper
- 44: nut

The invention claimed is:

1. A semiconductor device comprising:

a semiconductor element having a front surface and a rear surface;

a pair of heat sinks disposed facing each other so as to sandwich the semiconductor element, and attached respectively to the front surface and the rear surface; and a fastening screw fastening the pair of the heat sinks in the facing direction, the fastening screw having insulation property;

wherein threads are arranged on at least a part of the fastening screw in an axis direction of the fastening screw between the pair of the heat sinks, and sealing resin is filled between the pair of the heat sinks, the sealing resin being in close contact with the threads of the fastening screw.

\* \* \* \* \*